(12) United States Patent
Su et al.

(10) Patent No.: US 11,402,407 B2
(45) Date of Patent: Aug. 2, 2022

(54) POSITIONABLE PROBE CARD AND MANUFACTURING METHOD THEREOF

(71) Applicant: MPI Corporation, Hsinchu County (TW)

(72) Inventors: Zhi-Wei Su, Hsinchu County (TW); Tzung-Je Tzeng, Hsinchu County (TW); Wen-Chi Chen, Hsinchu County (TW); Huo-Kang Hsu, Hsinchu County (TW); Hsueh-Chih Wu, Hsinchu County (TW); Sheng-Wei Lin, Hsinchu County (TW); Chin-Yi Lin, Hsinchu County (TW); Che-Wei Lin, Hsinchu County (TW); Jian-Kai Hong, Hsinchu County (TW); Shu-Jui Chang, Hsinchu County (TW)

(73) Assignee: MPI Corporation, Hsinchu County (TW)

( * ) Notice: Subject to any disclaimer, the term of this patent is extended or adjusted under 35 U.S.C. 154(b) by 0 days.

(21) Appl. No.: 17/118,564

(22) Filed: Dec. 10, 2020

(65) Prior Publication Data

US 2021/0181237 A1 Jun. 17, 2021

(30) Foreign Application Priority Data

Dec. 16, 2019 (TW) .................................. 108146042

(51) Int. Cl.
*G01R 1/073* (2006.01)
*G01R 1/067* (2006.01)
*G01R 31/28* (2006.01)

(52) U.S. Cl.
CPC ..... *G01R 1/07342* (2013.01); *G01R 1/06794* (2013.01); *G01R 31/2887* (2013.01)

(58) Field of Classification Search
CPC ............ G01R 1/07342; G01R 1/06794; G01R 31/2887; G01R 1/07378; G01R 3/00; G01R 1/067; G01R 1/073
See application file for complete search history.

(56) References Cited

U.S. PATENT DOCUMENTS

| 7,795,892 B2 * | 9/2010 | Yamada | G01R 1/07378 324/756.03 |
| 2001/0054905 A1 * | 12/2001 | Khandros | B23K 20/004 324/755.05 |
| 2009/0212798 A1 * | 8/2009 | Kasukabe | G01R 1/07378 324/754.07 |
| 2009/0219043 A1 * | 9/2009 | Nakayama | G01R 31/2889 324/762.05 |

(Continued)

FOREIGN PATENT DOCUMENTS

| TW | 201111799 A | 4/2011 |
| TW | 201839408 A | 11/2018 |

*Primary Examiner* — Lee E Rodak
(74) *Attorney, Agent, or Firm* — CKC & Partners Co., LLC

(57) ABSTRACT

A positionable probe card includes a space transformer, a plurality of positioning pins, and a probe head. The space transformer includes a space transforming substrate, the space transforming substrate includes a plurality of apertures, and the positioning pins are respectively fixed in the apertures. The probe head includes a plurality of positioning holes, and the positioning pins are respectively inserted into corresponding positioning holes. In addition, a method of manufacturing a positionable probe card is also disclosed herein.

18 Claims, 6 Drawing Sheets

(56) References Cited

U.S. PATENT DOCUMENTS

2018/0024167 A1* 1/2018 Maggioni .......... G01R 1/07378
                                                          324/750.24
2020/0182907 A1* 6/2020 Ito ..................... G01R 1/07307

* cited by examiner

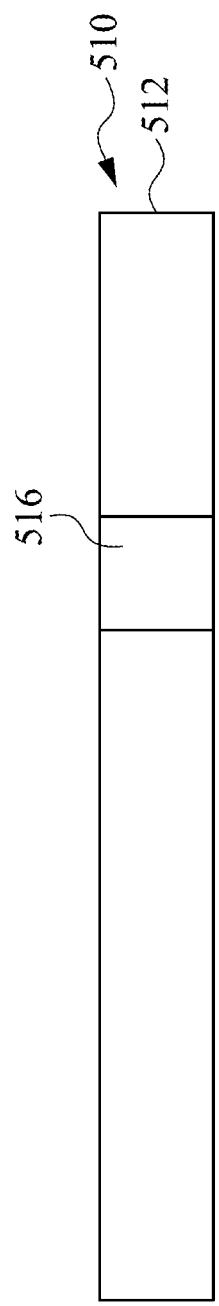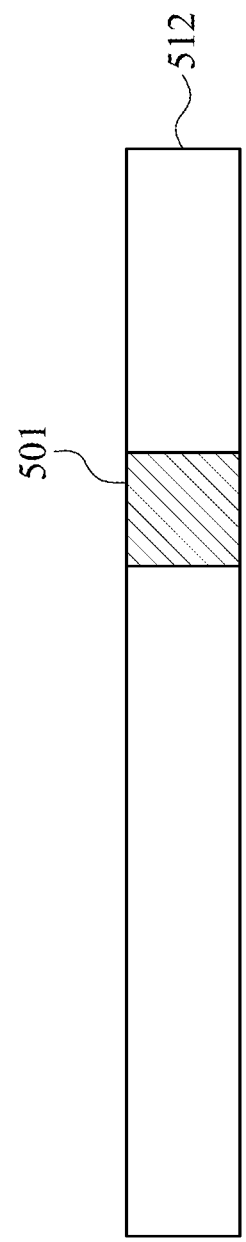
Fig. 5A
Fig. 5B

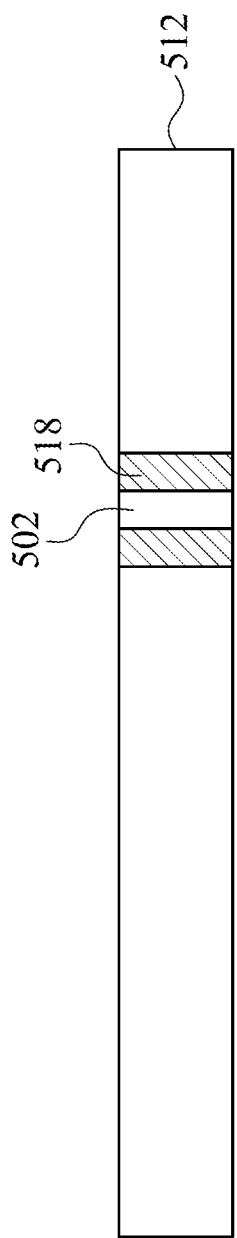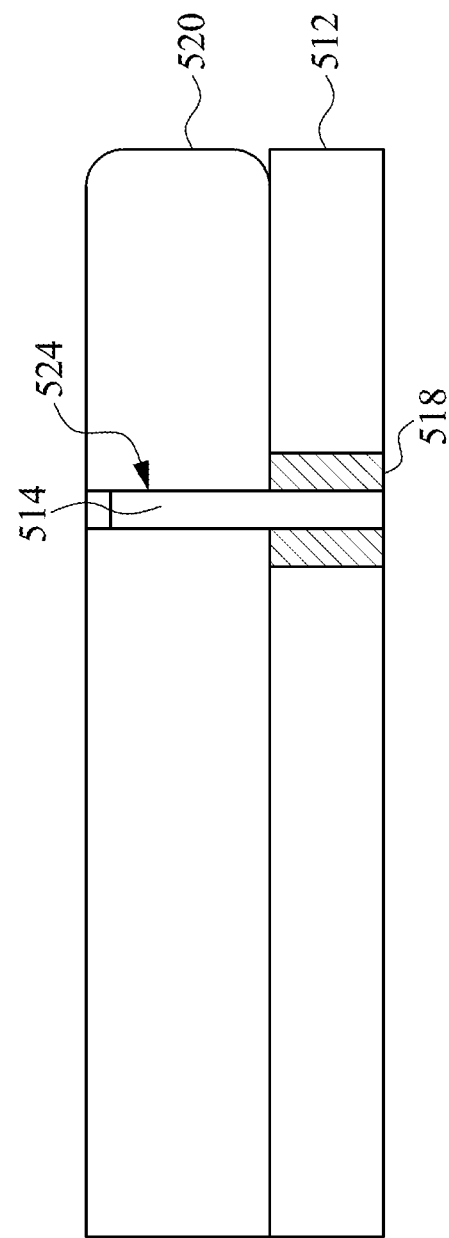

POSITIONABLE PROBE CARD AND MANUFACTURING METHOD THEREOF

RELATED APPLICATIONS

This application claims priority to Taiwan Application Serial No. 108146042, filed Dec. 16, 2019, the disclosures of which are incorporated herein by reference in their entireties.

TECHNICAL FIELD

The present disclosure generally relates to a probe card and a manufacturing method thereof. More particularly, the present disclosure relates to a positionable probe card and a manufacturing method thereof.

BACKGROUND

A main function of the probe card is to directly contact the solder pads or bumps on the test object (such as unpackaged wafers, chips, or dies) through the probes thereof, and the probe card can cooperate with the tester and the control software to achieve the purpose of measurement so as to further screen out the defective products. Normally, the test signal is generated by the tester and sent to the device under test through the probe card, and then the test result signal is sent back from the device under test to the tester for further analysis.

The probe head of the probe card is an electrical connection structure with multiple probes. The fixations of the probe head and the space transformer are independent so that the relative position thereof may therefore be inaccurate so as to affect the stability of the test.

In addition, during the test, the fixing element of the probe card may be moved so as to cause a probe tail displacement, and the displacement may be caused by an unexpected impact force during the test, transportation or thermal expansion and contraction of different materials under the temperature variation so as to produce an unstable electrical transmission to further affect the accuracy of the test results.

Therefore, there is a need to improve the stability of the substrates of the probe head and the space transformer of the probe card to effectively improve the test stability and further improve the quality and accuracy of the overall probe test.

SUMMARY

A technical aspect of the present disclosure is to provide a positionable probe card to precisely fix the probe head and the space transformer thereof so as to improve the quality and accuracy of the overall probe test.

According to an embodiment of the present disclosure, a positionable probe card includes a space transformer, a plurality of positioning pins and a probe head. The space transformer has a space transforming substrate, and the space transforming substrate includes a plurality of apertures. The positioning pins are respectively fixed in the apertures. The probe head has a plurality of positioning holes, and the positioning pins are respectively inserted into the positioning holes. In addition, at least one of the positioning pins is eccentrically arranged in a corresponding aperture of the apertures.

In some embodiments, each of the positioning pins further includes a fixing ring to position the each of the positioning pins in the corresponding aperture of the apertures.

In some embodiments, the fixing ring is a cured fixing adhesive ring, a cured fixing adhesive block with a drilled hole or a cylindrical metal rod with a drilled hole.

In some embodiments, the fixing ring is made of a resin adhesive, and the resin adhesive includes a UV curable adhesive, an epoxy resin adhesive or a two-part epoxy resin adhesive.

In some embodiments, each of the positioning pins further includes a sleeve fixed between the fixing ring and the each of the positioning pins. In addition, the sleeve is a metal sleeve.

In some embodiments, the positioning pins include a first positioning pin and a second positioning pin, and a diameter of the first positioning pin is greater than a diameter of the second positioning pin.

According to another aspect of the present disclosure, a method of manufacturing positionable probe card includes the following steps. First, a space transformer is provided, and the space transformer includes a space transforming substrate. A plurality of apertures are formed in the space transforming substrate, and a plurality of positioning pins are fixed in the apertures. In addition, a probe head is positioned at one side of the space transformer with the positioning pins, and the probe head includes a plurality of positioning holes, the positioning pins are respectively inserted into the positioning holes, and at least one of the positioning pins is eccentrically arranged in a corresponding aperture of the apertures.

In some embodiments, a fixing ring is further formed in the corresponding aperture of the apertures to position the each of the positioning pins in the corresponding aperture of the apertures. In addition, the step of forming a fixing ring in the corresponding aperture of the apertures further includes embedding cylindrical materials in the apertures, drilling the cylindrical materials to form a plurality of positioning through holes and inserting the positioning pins into the positioning through holes.

In some embodiments, wherein the cylindrical materials is a cured fixing adhesive block or a cylindrical metal rod.

In some embodiments, the step of forming a fixing ring in the corresponding aperture of the apertures includes utilizing an alignment fixture to position the positioning pins in the apertures, and then utilizing a resin adhesive to fix the positioning pins in the apertures, and the resin adhesive includes a UV curable adhesive, an epoxy resin adhesive or a two-part epoxy resin adhesive.

In some embodiments, each of the positioning pins includes a sleeve, and the sleeve is fixed between the fixing ring and the each of the positioning pins, and the sleeve is a metal sleeve.

In some embodiments, the positioning pins include a first positioning pin and a second positioning pin, and a diameter of the first positioning pin is greater than a diameter of the second positioning pin.

In some embodiments, the space transforming substrate includes a multi-layer ceramic (MLC) substrate or a multi-layer organic (MLO) substrate fixed to the multi-layer ceramic substrate.

Hence, the positionable probe card and the method of manufacturing positionable probe card can effectively improve the assembly accuracy of the probe head and the space transformer, and improve the displacement caused by the external forces or the thermal expansion and contraction induced by the temperature variation due to the assembly process, the testing process or the transportation process so as to effectively improve the stability and accuracy of the probe card.

BRIEF DESCRIPTION OF THE DRAWINGS

The disclosure can be more fully understood by reading the following detailed description of the embodiments, with reference made to the accompanying drawings as follows:

FIGS. 5A to 5D are schematic side views while manufacturing a positionable probe card according to further still another embodiment of the present disclosure.

DETAILED DESCRIPTION

Figure 1:
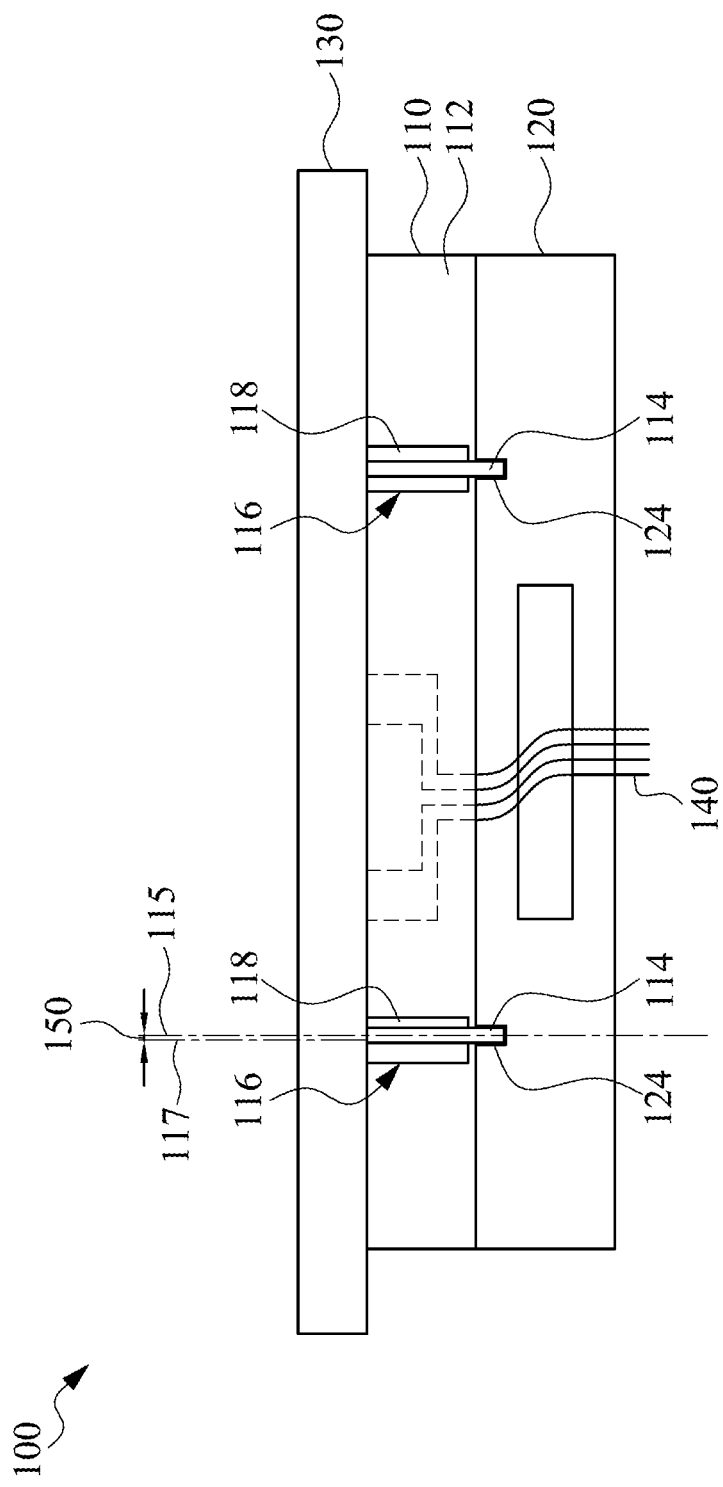
FIG. 1 is a schematic side view of a positionable probe card according to an embodiment of the present disclosure.

Drawings will be used below to disclose embodiments of the present disclosure. For the sake of clear illustration, many practical details will be explained together in the description below. However, it is appreciated that the practical details should not be used to limit the claimed scope. In other words, in some embodiments of the present disclosure, the practical details are not essential. Moreover, for the sake of drawing simplification, some customary structures and elements in the drawings will be schematically shown in a simplified way. Wherever possible, the same reference numbers are used in the drawings and the description to refer to the same or like parts.

Referring to FIG. 1, a schematic side view of a positionable probe card according to an embodiment of the present disclosure is illustrated. As the drawing illustrated, the positionable probe card 100 includes a space transformer 110, a plurality of positioning pins 114 and at least one probe head 120.

The space transformer 110 includes a space transforming substrate 112, and a plurality of apertures 116 are formed in the space transforming substrate 112. In some embodiments, the space transforming substrate 112 includes a multi-layer ceramic (MLC) substrate. A side of the space transforming substrate 112 facing the probe head 120 is called a device under test side (a DUT side; also referred as a wafer side), and the side of the space transforming substrate 112 opposite the probe head 120 is called a test machine side. The DUT side of the space transforming substrate 112 includes contact pads, similar to the positions of contact pads of the device under test, to contact the probes of the probe head 120. Therefore, the contact pads on the DUT side of the space transforming substrate 112 may be formed a test area. The drilling bit cannot contact the test area of the space transforming substrate 112 while drilling holes on the multi-layer ceramic substrate. However, because both the space transformer 110 and the probe head 120 have to be aligned to the test area, the actual positions of the drilling holes have to be adjusted to align the probe head 120 with the space transformer 110.

Consequently, while drilling holes on the multi-layer ceramic substrate of the space transforming substrate 112 for aligning with the connection area of the controlled collapse chip connection (C4) with noncontact machining process, the dimension and the positioning accuracy are difficult to reach a precise position requirement because the hardness of the ceramic material is very high. Therefore, it is difficult to process precise drilling holes on the space transforming substrate 112. In the embodiment, a plurality of apertures 116 are first formed in the space transforming substrate 112, and then a plurality of positioning pins 114 are respectively fixed in the apertures 116.

The probe head 120 includes a plurality of positioning holes 124. The positioning pins 114 are precisely aligned with and fixed in the space transforming substrate 112, and then inserted into the positioning holes 124 of the probe head 120 to effectively improve the assembly accuracy between the probe head 120 and the space transformer 110.

In addition, the probe head 120 and the space transformer 110 can be coupled to the circuit board 130 by a metal frame to align and fix to the circuit board 130 so as to allow the probes 140 to be electrically connected to the contact pads of the circuit board 130.

In some embodiments, the contact pads of the circuit board 130 can electrically connect the contact pads of the space transformer 110 with reflow soldering, an interposer or any other electrical connection device without departing from the scope or spirit of the present disclosure.

In some embodiments, the positioning pins 114 can directly fix in the apertures 116 of the space transforming substrate 112 to precisely align to the positioning holes 124 of the probe head 120 so as to improve the assembly accuracy between the probe head 120 and the space transformer 110.

In some embodiments, the positioning pins 114 can utilize fixing rings 118 to respectively fix the positioning pins 114 in the apertures 116 to precisely align to the positioning holes 124 of the probe head 120 so as to improve the assembly accuracy between the probe head 120 and the space transformer 110. In some embodiments, the fixing ring 118 is a fixing adhesive to glue the positioning pins 114 in the apertures 116, and the positioning pins 114 are precisely positioned in the apertures 116 with an alignment fixture and then the fixing adhesive is solidified to position and fix the positioning pins 114 in the apertures 116. In another embodiment, the fixing ring 118 is a cylindrical element made of a solidified fixing adhesive or a metal cylindrical element with a precise drilling hole to position and fix the positioning pins 114 in the apertures 116. Therefore, in some embodiments, at least one of the positioning pins 114 is eccentrically arranged in a corresponding aperture of the apertures 116 due to the conversion error of non-contact positioning. The eccentric distance of the center of the at least one of the positioning pins 114 and the center of the corresponding aperture of the apertures 116 can be compensated by the fixing ring 118 to absorb the original drilling errors of the apertures 116 so as to accurately position the at least one of the positioning pins 114 in the corresponding aperture of the apertures 116 with the fixing ring 118 (a metal ring or a ring made of the fixing adhesive). It is worth noting that the eccentric distance 150 is meaning that the center 115 of the positioning pin 114 is not aligned with the center 117 of the aperture 116 as shown on the FIG. 1.

In some embodiments, the fixing adhesive includes a resin adhesive, for example, a UV curable adhesive, an epoxy resin adhesive or a two-part epoxy resin adhesive without departing from the scope of the present disclosure.

In some embodiments, the positioning pins 114 include a first positioning pin having a larger diameter and a second positioning pin having a smaller diameter, and the positioning holes 124 include a first positioning hole having a larger diameter to couple to the first positioning pin and a second positioning hole having a smaller diameter to couple to the second positioning pin so as to improve the position accuracy, and avoid a misinstallation or a reverse installation of the probe head 120 and the space transformer 110, whereby effectively improving the probe card accuracy.

Figure 2:
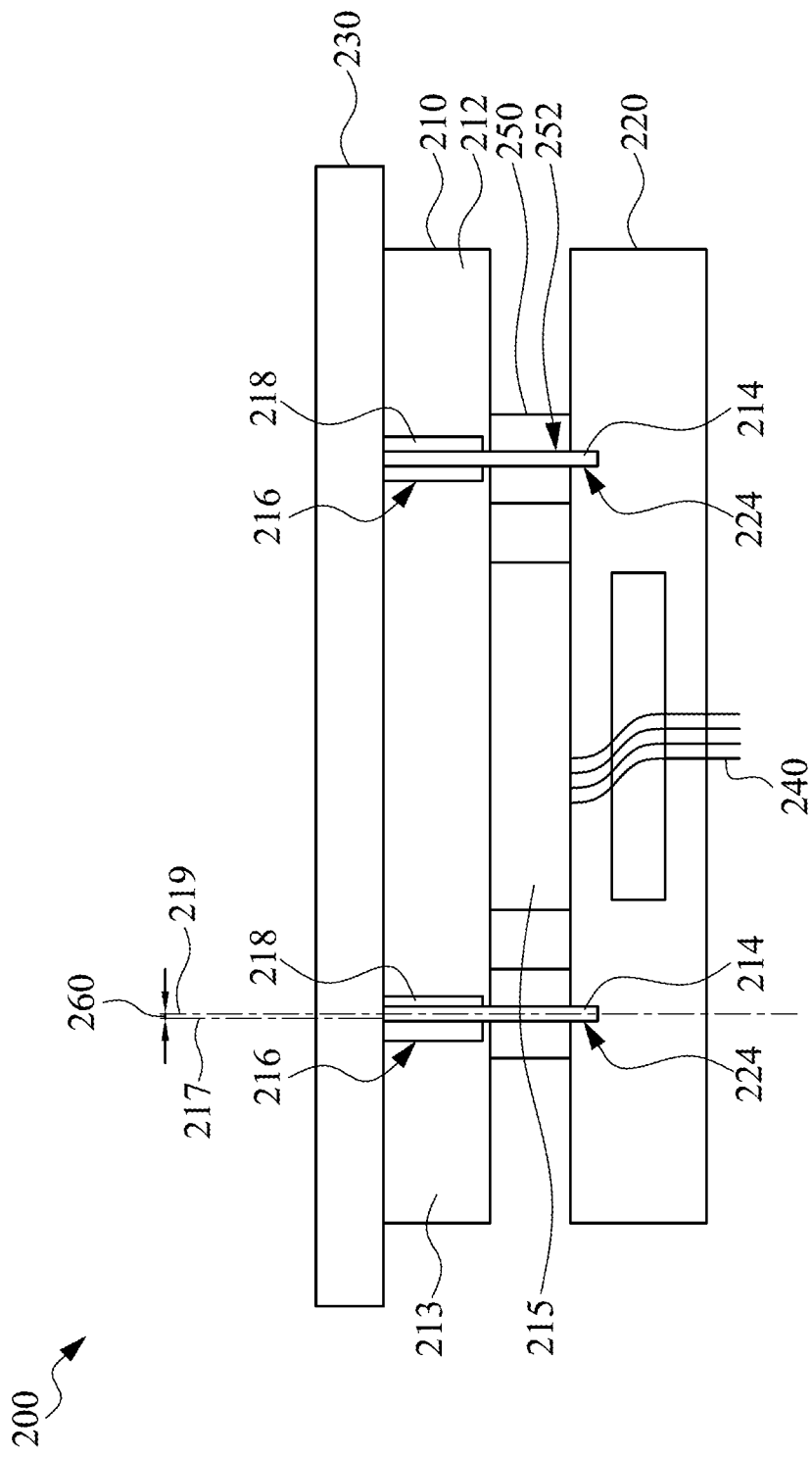
FIG. 2 is a schematic side view of a positionable probe card according to another embodiment of the present disclosure.

FIG. 2 is a schematic side view of a positionable probe card according to another embodiment of the present disclosure. The positionable probe card 200 includes a space transformer 210, a plurality of positioning pins 214 and a probe head 220.

In addition, the space transformer 210 includes a space transforming substrate 212, and a plurality of apertures 216 are formed in the space transforming substrate 212. In some embodiments, the space transforming substrate 212 includes a multi-layer ceramic (MLC) substrate 213 and a multi-layer organic (MLO) substrate 215 fixed to the multi-layer ceramic substrate 213.

In the embodiment, a plurality of apertures 216 are first formed in the space transforming substrate 212, and then a plurality of positioning pins 214 are respectively fixed in the apertures 216.

The probe head 220 includes a plurality of positioning holes 224. The positioning pins 214 are precisely aligned with and fixed in the space transforming substrate 212, and then inserted into the positioning holes 224 of the probe head 220 to effectively improve the assembly accuracy between the probe head 220 and the space transformer 210.

In addition, because the multi-layer organic substrate 215 is arranged on the multi-layer ceramic substrate 213, a supporting component 250 is disposed between the probe head 220 and the space transformer 210. The supporting component 250 has an opening 252 to allow the positioning pin 214 to insert therethrough and to allow the positioning pin 214 to be coupled with the positioning hole 224 of the probe head 220.

In some embodiments, the probe head 220 and the space transformer 210 can be coupled to the circuit board 230 by a metal frame to align and fix to the circuit board 230 so as to allow the probes 240 to be electrically connected to the contact pads of the circuit board 230.

In some embodiments, the positioning pins 214 can directly fix in the apertures 216 of the space transforming substrate 212 to precisely align to the positioning holes 224 of the probe head 220 so as to improve the assembly accuracy between the probe head 220 and the space transformer 210.

In some embodiments, the positioning pins 214 can utilize fixing rings 218 to respectively fix the positioning pins 214 in the apertures 216 to precisely align to the positioning holes 224 of the probe head 220 so as to improve the assembly accuracy between the probe head 220 and the space transformer 210. In some embodiments, the fixing ring 218 is a fixing adhesive to glue the positioning pins 214 in the apertures 216, and the positioning pins 214 are precisely positioned in the apertures 216 with an alignment fixture and then the fixing adhesive is solidified to position and fix the positioning pins 214 in the apertures 216. In another embodiment, the fixing ring 218 is a cylindrical element made of a solidified fixing adhesive or a metal cylindrical element with a precise drilling hole to position and fix the positioning pins 214 in the apertures 216. Therefore, in some embodiments, at least one of the positioning pins 214 is eccentrically arranged in a corresponding aperture of the apertures 216. It is worth noting that the eccentric distance 260 is meaning that the center 219 of the positioning pin 214 is not aligned with the center 217 of the aperture 216 as shown on the FIG. 2.

In some embodiments, the fixing adhesive includes a resin adhesive, for example, a UV curable adhesive, an epoxy resin adhesive or a two-part epoxy resin adhesive without departing from the scope of the present disclosure.

In some embodiments, the positioning pins 214 include a first positioning pin having a larger diameter and a second positioning pin having a smaller diameter, and the positioning holes 224 include a first positioning hole having a larger diameter to couple to the first positioning pin and a second positioning hole having a smaller diameter to couple to the second positioning pin so as to improve the position accuracy, and avoid a misinstallation or a reverse installation, i.e. up and down or left and right reverse installation, of the probe head 220 and the space transformer 210, whereby effectively improving the probe card accuracy.

Figure 3A:
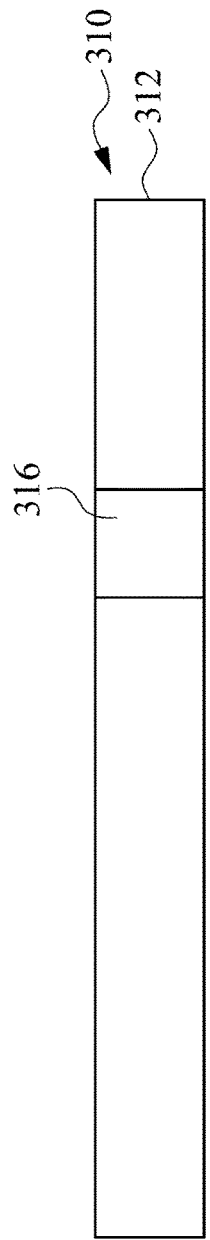
FIGS. 3A to 3C are schematic side views while manufacturing a positionable probe card according to further another embodiment of the present disclosure.
Figure 3B:
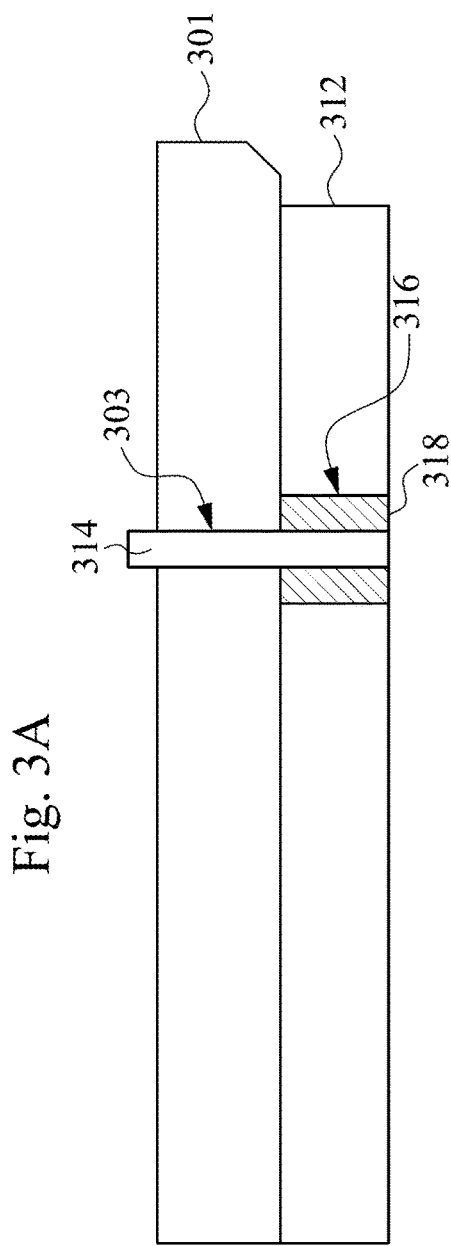
Figure 3C:
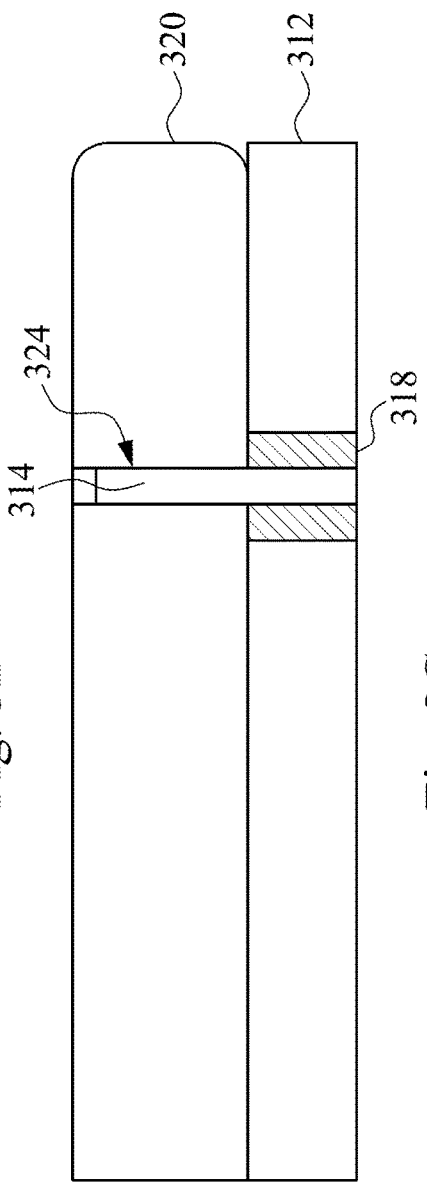

FIGS. 3A to 3C are schematic side views while manufacturing a positionable probe card according to further another embodiment of the present disclosure. Referring to FIG. 3A, in the method of manufacturing positionable probe card, a space transformer 310 is first provided. In some embodiments, the space transformer 310 includes a space transforming substrate 312, for example, a multi-layer ceramic substrate and/or a multi-layer organic substrate. A plurality of apertures 316 can be formed in the space transforming substrate 312. The following description is merely exemplarily illustrated with an aperture 316 and a positioning pin 314 without limiting the scope of the present disclosure.

Subsequently, referring to FIG. 3B, an alignment fixture 301 is utilized to insert a positioning pin 314 into the aperture 316, and a fixing adhesive 318 is utilized to fix the positioning pin 314 in the aperture 316. In addition, the alignment fixture 301 includes a bore 303 with a precise location so that the positioning pin 314 can be positioned at the correct position of the space transforming substrate 312 and the probe head 320 when the alignment fixture 301 inserts the positioning pin 314 into the aperture 316. Therefore, although the diameter of the aperture 316 is greater than the diameter of the positioning pin 314, the fixing adhesive 318 can still fix the positioning pin 314 in the aperture 316 at the correct position so that the positioning pin 314 can be positioned in the correct position of the space transforming substrate 312 and the probe head 320 to effectively reduce the precision requirement for drilling holes in the ceramic substrates. In some embodiments, when the positioning pin 314 is fixed in the aperture 316, the positioning pin 314 is eccentrically arranged in the center of the aperture 316 so as to position the positioning pin 314 in the correct position of the space transforming substrate 312 and the probe head 320.

In some embodiments, the fixing adhesive 318 is formed a fixing ring to position the positioning pin 314 in the aperture 316.

In some embodiments, the fixing adhesive 318 includes a resin adhesive, for example, a UV curable adhesive, an epoxy resin adhesive, or a two-part epoxy resin adhesive without departing from the scope of the present disclosure. When the UV curable adhesive is utilized to position the positioning pin 314 in the aperture 316, a transparent platform, for example a glass platform, can be utilized. The space transforming substrate 312 is disposed on the transparent platform and ultraviolet rays are emitted from the bottom side of the transparent platform to cure the fixing adhesive 318 so as to fix the positioning pin 314 in the aperture 316. In addition, the epoxy resin adhesive can be cured by heating or any other process. Furthermore, the two-part epoxy resin adhesive can be mixed before injecting into the aperture 316 without departing from the scope of the present disclosure. In addition, the fixing ring made of the fixing adhesive can be formed by a single layer or multiple layers of different thermal expansion material to facilitate stable operation at high temperatures.

Subsequently, referring to FIG. 3C, the probe head 320 can be fixed on one side of the space transformer 310 with the positioning pin 314. The probe head 320 includes a plurality of positioning holes 324. The positioning pin 314 is precisely inserted into the positioning hole 324. Preferably, the positioning pin 314 and the positioning hole 324 of the probe head 320 are concentrically configured.

In some embodiments, the positioning pins 314 include a first positioning pin having a larger diameter and a second positioning pin having a smaller diameter, and the positioning holes 324 include a first positioning hole having a larger diameter to couple to the first positioning pin and a second positioning hole having a smaller diameter to couple to the second positioning pin so as to improve the position accuracy, and avoid a misinstallation or a reverse installation of the probe head 220 and the space transformer 210, whereby effectively improving the probe card accuracy.

Figure 4A:
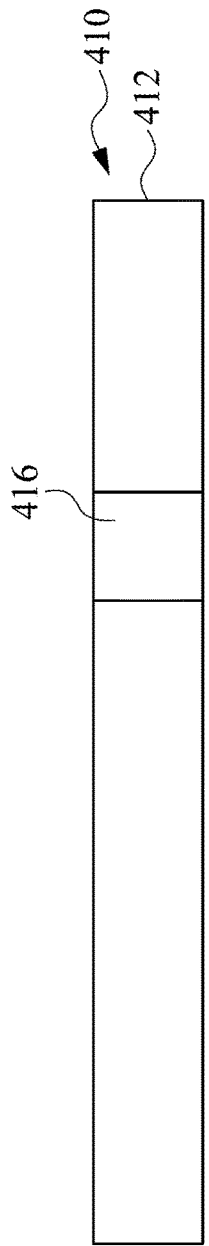
FIGS. 4A to 4C are schematic side views while manufacturing a positionable probe card according to still another embodiment of the present disclosure.
Figure 4B:
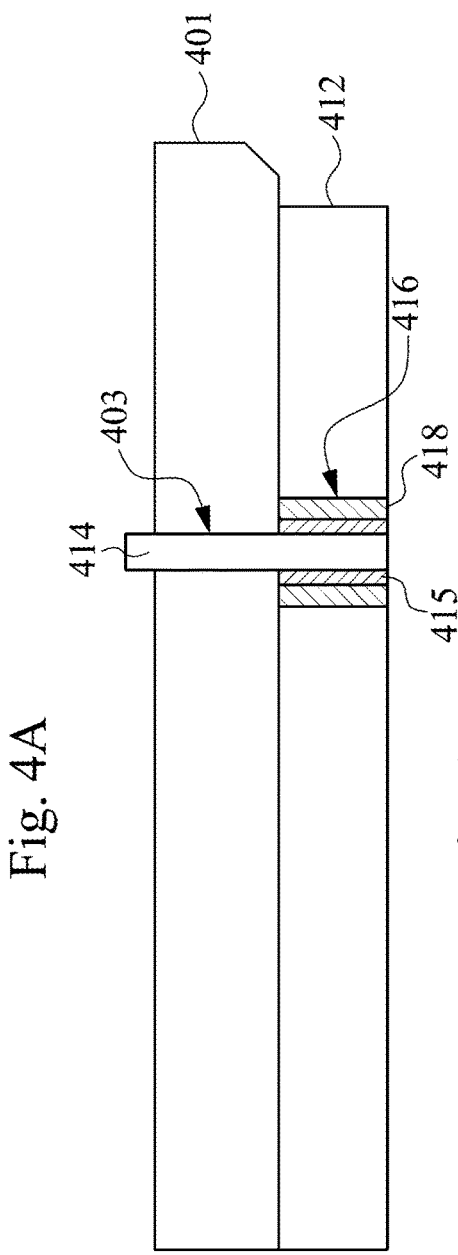
Figure 4C:
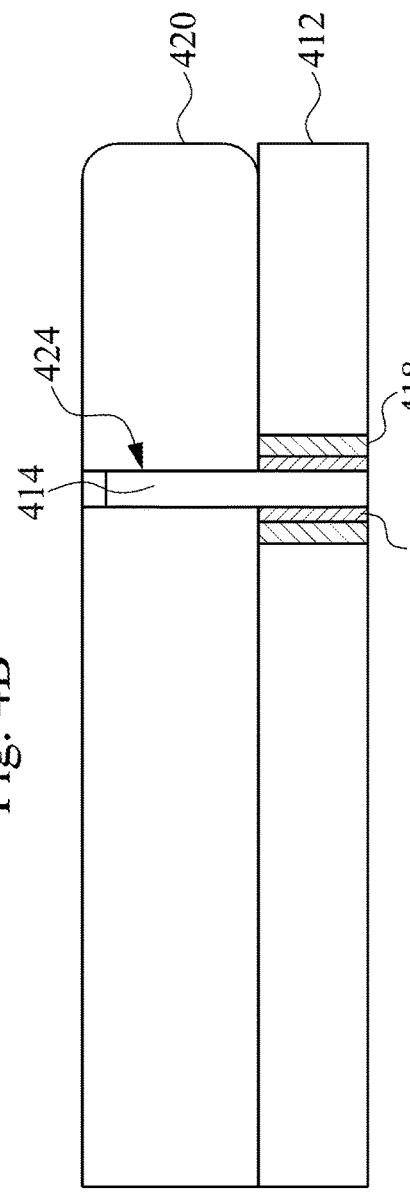

FIGS. 4A to 4C are schematic side views while manufacturing a positionable probe card according to still another embodiment of the present disclosure. Referring to FIG. 4A, in the method of manufacturing positionable probe card, a space transformer 410 is first provided. In some embodiments, the space transformer 410 includes a space transforming substrate 412, for example, a multi-layer ceramic substrate and/or a multi-layer organic substrate. A plurality of apertures 416 can be formed in the space transforming substrate 412. The following description is merely exemplarily illustrated with an aperture 416 and a positioning pin 414 without limiting the scope of the present disclosure.

Subsequently, referring to FIG. 4B, an alignment fixture 401 is utilized to insert a positioning pin 414 into the aperture 416, and a fixing adhesive 418 is utilized to fix the positioning pin 414 in the aperture 416. It is worth noting that a sleeve 415 is equipped on the positioning pin 414. In addition, the alignment fixture 401 includes a bore 403 with precise locations so that the positioning pin 414 can be positioned at a correct position of the space transforming substrate 412 and the probe head 420 when the alignment fixture 401 inserts the positioning pin 414 into the aperture 416. Therefore, although the diameter of the aperture 416 is greater than the diameter of the positioning pin 414 and the diameter of the sleeve 415, the fixing adhesive 418 can still fix the positioning pin 414 and the sleeve 415 in the aperture 416 at the correct position so that the positioning pin 414 can be positioned in the correct position of the space transforming substrate 412 and the probe head 420 to effectively reduce the precision requirement for drilling holes in the ceramic substrates.

Since the sleeve 415 is equipped on the positioning pin 414, the sleeve 415 can be fixed to the positioning pin 414 as well as the positioning pin 414 can be removed from the sleeve 415 so that the positioning pin 414 can conveniently install on and remove from the space transforming substrate 412. The sleeve 415 can be hidden in the apertures 416 of the space transforming substrate 412 without protruding from the surface of the space transforming substrate 412. Therefore, after the space transforming substrate 412 is reworked or processed, the positioning pin 414 can be conveniently inserted into the sleeve 415 again so that the space transforming substrate 412 can be directly utilized without positioning the positioning pin 414 again.

Furthermore, because the positioning pin 414 and sleeve 415 may be processed by precisely machining to achieve higher accuracy and position accuracy, for example, by turning, grinding, polishing or boring processes to improve the accuracy thereof to perform high-precision assembly and positioning.

In some embodiments, the sleeve 415 includes a metal sleeve, such as a copper sleeve or a stainless steel sleeve without departing from the spirit and scope of the present invention.

In the same manner, the fixing adhesive 418 is formed a fixing ring to position the positioning pin 414 in the aperture 416.

In some embodiments, the fixing adhesive 418 includes a resin adhesive, for example, a UV curable adhesive, an epoxy resin adhesive, or a two-part epoxy resin adhesive without departing from the scope of the present disclosure. When the UV curable adhesive is utilized to position the positioning pin 414 and the aperture 416, a transparent platform, for example a glass platform, can be utilized. The space transforming substrate 412 is disposed on the transparent platform and ultraviolet rays are emitted from the bottom side of the transparent platform to cure the fixing adhesive 418 so as to fix the positioning pin 414 in the aperture 416. In addition, the epoxy resin adhesive can be cured by heating or any other process. Furthermore, the two-part epoxy resin adhesive can be mixed before injecting into the aperture 416 without departing from the scope of the present disclosure.

Subsequently, referring to FIG. 4C, the probe head 420 can be fixed on one side of the space transformer 410 with the positioning pin 414. The probe head 420 includes a plurality of positioning holes 424. The positioning pin 414 is precisely inserted into the positioning hole 424.

In some embodiments, the positioning pin 414 and the sleeve 415 are concentrically configured, and the positioning pin 414 and the sleeve 415 are eccentrically arranged with the center of the aperture 416 after the positioning pin 414 is fixed in the apertures 416 so that the positioning pin 414 can be located in the correct position of the space transforming substrate 412 and the probe head 420. The positioning pin 414, the sleeve 415 and the positioning hole 424 of the probe head 420 are preferably configured concentrically.

In some embodiments, the positioning pins 414 include a first positioning pin having a larger diameter and a second positioning pin having a smaller diameter, and the positioning holes 424 include a first positioning hole having a larger diameter to couple to the first positioning pin and a second positioning hole having a smaller diameter to couple to the second positioning pin so as to improve the position accuracy, and avoid a misinstallation or a reverse installation of the probe head 420 and the space transformer 410, whereby effectively improving the probe card accuracy.

It is worth noting that the sleeve can be also equipped on the positioning pin of the embodiments of FIG. 1 and FIGS. 3A to 3C or the following FIGS. 5A to 5D without departing from the scope of the present disclosure.

Further referring to FIGS. 5A to 5D, the method of manufacturing positionable probe card according to further still another embodiment of the present disclosure is illustrated. Referring to FIG. 5A, in the method of manufacturing positionable probe card, a space transformer 510 is first provided. In some embodiments, the space transformer 510 includes a space transforming substrate 512, for example, a multi-layer ceramic substrate and/or a multi-layer organic substrate. A plurality of apertures 516 can be formed in the space transforming substrate 512. The following description is merely exemplarily illustrated with an aperture 516 and a positioning pin 514 without limiting the scope of the present disclosure.

Subsequently, referring to FIG. 5B, a cylindrical element 501 is embedded in the aperture 516. Referring to FIG. 5C, a precise drilling process is performed on the cylindrical element 501 to precisely form a positioning through hole 502 in the cylindrical element 501 so as to provide a required fixing ring 518 in the aperture 516. The cylindrical element 501 can be a solidified resin adhesive or a cylindrical metal bar without departing from the scope of the present disclosure. The cylindrical element 501 can be any material that can be processed easier than the ceramic material to conveniently drill through holes in the cylindrical element 501 embedded in the aperture 516 in the correct position to improve the assembly accuracy of the space transforming substrate 512 and the probe head 520.

Referring to FIG. 5D, the probe head 520 can be fixed on one side of the space transformer 510 with the positioning pin 514. The probe head 520 includes a plurality of positioning holes 524. The positioning pin 514 is precisely inserted into the positioning hole 524.

Therefore, in some embodiments, the positioning pin 514 is eccentrically arranged with the center of the aperture 516 after the positioning pin 514 is fixed in the apertures 516 so that the positioning pin 514 can be located in the correct position of the space transforming substrate 512 and the probe head 520. The positioning pin 514 and the positioning hole 524 of the probe head 520 are preferably configured concentrically.

In the same manner, in some embodiments, the positioning pins 514 include a first positioning pin having a larger diameter and a second positioning pin having a smaller diameter, and the positioning holes 524 include a first positioning hole having a larger diameter to couple to the first positioning pin and a second positioning hole having a smaller diameter to couple to the second positioning pin so as to improve the position accuracy, and avoid a misinstallation or a reverse installation of the probe head 520 and the space transformer 510, whereby effectively improving the probe card accuracy.

Accordingly, the positionable probe card and the method of manufacturing positionable probe card of the above-mentioned embodiments of the present invention can effectively improve the assembly accuracy of the probe head and the space transformer, and improve the displacement caused by the external forces or the thermal expansion and contraction induced by the temperature variation due to the assembly process, the testing process or the transportation process so as to effectively improve the stability and accuracy of the probe card.

It will be apparent to the person having ordinary skill in the art that various modifications and variations can be made to the structure of the present disclosure without departing from the scope or spirit of the present disclosure. In view of the foregoing, it is intended that the present disclosure cover modifications and variations of the present disclosure provided they fall within the scope of the following claims.

What is claimed is:

1. A positionable probe card, comprising:
a space transformer, having a space transforming substrate, wherein the space transforming substrate includes a plurality of apertures;
a plurality of positioning pins respectively fixed in the apertures; and
a probe head having a plurality of positioning holes, the positioning pins respectively inserted into the positioning holes, wherein a center of each positioning pin of the positioning pins is aligned with a center of a corresponding positioning hole of the positioning holes of the probe head, and at least one of the positioning pins is eccentrically arranged in a corresponding aperture of the apertures of the space transformer.

2. The positionable probe card of claim 1, wherein the space transforming substrate comprises a multi-layer ceramic (MLC) substrate.

3. The positionable probe card of claim 2, wherein the space transforming substrate further comprises a multi-layer organic (MLO) substrate fixed to the multi-layer ceramic substrate.

4. The positionable probe card of claim 1, wherein each of the positioning pins further comprises a fixing ring to position the each of the positioning pins in the corresponding aperture of the apertures.

5. The positionable probe card of claim 4, wherein the fixing ring is a cured fixing adhesive ring, a cured fixing adhesive block with a drilled hole, or a cylindrical metal rod with a drilled hole.

6. The positionable probe card of claim 5, wherein the fixing ring is made of a resin adhesive, and the resin adhesive comprises a UV curable adhesive, an epoxy resin adhesive or a two-part epoxy resin adhesive.

7. The positionable probe card of claim 4, wherein the each of the positioning pins further includes a sleeve fixed between the fixing ring and the each of the positioning pins.

8. The positionable probe card of claim 7, wherein the sleeve is a metal sleeve.

9. The positionable probe card of claim 7, wherein the positioning pins comprise a first positioning pin and a second positioning pin, wherein a diameter of the first positioning pin is greater than a diameter of the second positioning pin.

10. A method of manufacturing positionable probe card, comprising:
providing a space transformer, wherein the space transformer includes a space transforming substrate;
forming a plurality of apertures in the space transforming substrate;
fixing a plurality of positioning pins in the apertures; and
positioning a probe head at one side of the space transformer with the positioning pins, wherein the probe head comprises a plurality of positioning holes, the positioning pins respectively inserted into the positioning holes, wherein a center of each positioning pin of the positioning pins is aligned with a center of a corresponding positioning hole of the positioning holes of the probe head, and at least one of the positioning pins is eccentrically arranged in a corresponding aperture of the apertures of the space transformer.

11. The method of manufacturing positionable probe card of claim 10, wherein the space transforming substrate comprises a multi-layer ceramic (MLC) substrate.

12. The method of manufacturing positionable probe card of claim 11, wherein the space transforming substrate further comprises a multi-layer organic (MLO) substrate fixed to the multi-layer ceramic substrate.

13. The method of manufacturing positionable probe card of claim 10, further comprising forming a fixing ring in the corresponding aperture of the apertures to position the each of the positioning pins in the corresponding aperture of the apertures.

14. The method of manufacturing positionable probe card of claim 13, wherein the step of forming a fixing ring in the corresponding aperture of the apertures further comprises:
   embedding cylindrical materials in the apertures;
   drilling the cylindrical materials to form a plurality of positioning through holes; and
   inserting the positioning pins into the positioning through holes.

15. The method of manufacturing positionable probe card of claim 14, wherein the cylindrical materials is a cured fixing adhesive block or a cylindrical metal rod.

16. The method of manufacturing positionable probe card of claim 13, wherein the step of forming a fixing ring in the corresponding aperture of the apertures comprises:
   utilizing an alignment fixture to position the positioning pins in the apertures, and then utilizing a resin adhesive to fix the positioning pins in the apertures, wherein the resin adhesive comprises a UV curable adhesive, an epoxy resin adhesive or a two-part epoxy resin adhesive.

17. The method of manufacturing positionable probe card of claim 16, wherein the each of the positioning pins includes a sleeve, and the sleeve is fixed between the fixing ring and the each of the positioning pins, wherein the sleeve is a metal sleeve.

18. The method of manufacturing positionable probe card of claim 17, wherein the positioning pins comprise a first positioning pin and a second positioning pin, wherein a diameter of the first positioning pin is greater than a diameter of the second positioning pin.

* * * * *